(12) United States Patent
Nardi et al.

(10) Patent No.: US 9,230,877 B2
(45) Date of Patent: Jan. 5, 2016

(54) METHODS OF FORMING SERPENTINE THERMAL INTERFACE MATERIAL AND STRUCTURES FORMED THEREBY

(71) Applicant: Intel Corporation, Santa Clara, CA (US)

(72) Inventors: Patrick Nardi, Scottsdale, AZ (US); Kelly P. Lofgreen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 364 days.

(21) Appl. No.: 13/724,511

(22) Filed: Dec. 21, 2012

(65) Prior Publication Data

US 2014/0177166 A1 Jun. 26, 2014

(51) Int. Cl.
*H01L 21/00* (2006.01)
*H01L 23/34* (2006.01)
*H01L 23/367* (2006.01)
*G06F 1/20* (2006.01)
*F28F 3/02* (2006.01)

(52) U.S. Cl.
CPC .............. *H01L 23/3672* (2013.01); *G06F 1/20* (2013.01); *F28F 3/025* (2013.01); *H01L 2224/18* (2013.01); *H01L 2224/32245* (2013.01); *H01L 2924/0002* (2013.01); *H01L 2924/16152* (2013.01)

(58) Field of Classification Search
CPC ....................... H01L 23/3672; H01L 23/49568
USPC ............................ 257/706, 717–722; 438/122
See application file for complete search history.

(56) References Cited

U.S. PATENT DOCUMENTS 3,705,676 A * 12/1972 Overly et al. ................. 226/97.3
3,887,299 A * 6/1975 Profant ....................... 415/173.4
5,911,511 A * 6/1999 Saville ........................... 384/106

* cited by examiner

*Primary Examiner* — Calvin Lee
(74) *Attorney, Agent, or Firm* — Winkle, PLLC

(57) ABSTRACT

Methods of forming a microelectronic packaging structure and associated structures formed thereby are described. Those methods may include forming a thermal interface material comprising a thermally conductive serpentine foil located between a first and a second interface material. The serpentine foil may be in a parallel position or a rotated position, in embodiments.

41 Claims, 8 Drawing Sheets

US 9,230,877 B2

METHODS OF FORMING SERPENTINE THERMAL INTERFACE MATERIAL AND STRUCTURES FORMED THEREBY

BACKGROUND OF THE INVENTION

As microelectronic packaging technology advances for higher processor performance, advances in packaging structures may include improving temperature management when implementing thermal interface materials (TIMs). Many packaging applications require the use of TIMs, wherein the TIM may be used within a package structure itself, and in locations outside the package structure. Thermal performance is an important requirement of a TIM. Some package applications may possess more aggressive thermal requirements, such as packages comprising server central processing units (CPU's) for example, while other applications, such as packages comprising memory dies for example, may have less aggressive thermal requirements. Additionally, it is important for a TIM to provide good mechanical coupling between surfaces. Some applications may require a TIM to be a compliant link in order to reduce the risk of mechanical failure during operation, while other applications may require a more rigid TIM for optimal mechanical performance.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
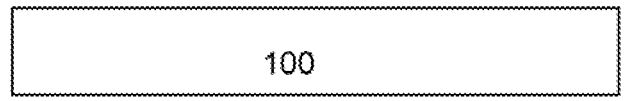
FIGS. 1*a*-1*h* represent structures according to various embodiments.

In the following detailed description, reference is made to the accompanying drawings that show, by way of illustration, specific embodiments in which the methods and structures may be practiced. These embodiments are described ire sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as TIM structures associated with various package structures, are described. Those methods/structures may include forming a TIM comprising a thermally conductive serpentine foil material located between a first and a second interface material, in embodiments. The serpentine foil may be in a parallel position or a rotated position, in embodiments. The TIM structures of the various embodiments disclosed herein greatly improve both thermal and mechanical reliability of package structures incorporating the TIM structures included herein.

FIGS. 1*a*-1*h* illustrate embodiments of methods of forming microelectronic structures, such as a TIM structure (FIG. 1*a*). In an embodiment, a substrate 100 may be provided which may comprise at least one of a top surface of a package substrate 100 and a top surface of a microelectronic die 100, for example. In other embodiments, the substrate 100 may comprise any suitable material that may comprise portions of a microelectronic device upon which a TIM may be formed.

Figure 1B:

In an embodiment, a first interface material 102, which may comprise a thin coating of a soft, curable and/or reflowable material, may be formed/placed on the substrate 100 (FIG. 1*b*). The first interface material 102 may comprise a wide range of thermal materials, including thermal grease, thermal epoxy, polymers, phase-change materials, solder materials such as tin and/or indium, and combinations thereof. The selection of particular first interface materials 102 may depend upon balancing requirements for thermal reliability/performance, mechanical reliability, assembly and cost, and may vary depending upon the particular application. In an embodiment, the thickness of the first interface material 102 may comprise about 1 microns to about 100 microns, but may vary according to the particular application.

In an embodiment, the first interface material 102 may serve to reduce the thermal contact resistance between a subsequently placed/formed serpentine foil component (to be described further herein) and the substrate 100 and/or a subsequently placed/formed integrated heat structure (IHS). Overall thermal performance may thus be improved in devices utilizing the TIM structures herein, but may comprise other materials depending upon the particular application.

Figure 1C:
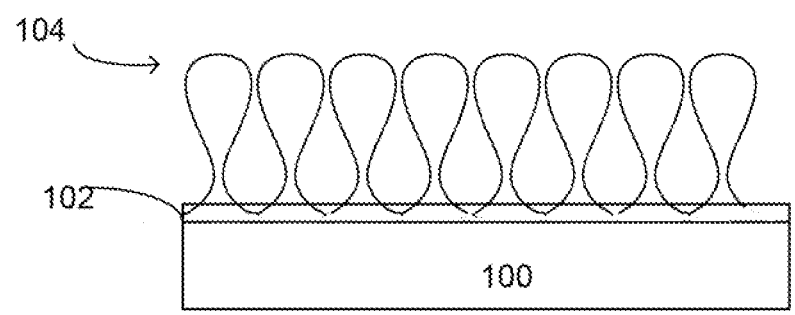

A serpentine foil 104, may be formed/placed on the first interface material 102 (FIG. 1*c*). The serpentine foil 104 may comprise a thermally conductive foil material such as copper (which may be advantageous due to its high thermal performance and good ductility), for example, but may comprise any suitable foil material according to the particular application. In an embodiment, the serpentine foil 104 may comprise a thickness between about 100 angstroms to about 1000 microns, but may comprise thicknesses outside this range according to the particular design. The serpentine foil 104 serves to provide a direct, unbroken thermal path between the first interface material 104 and a subsequently formed second thermal interface material 106. The serpentine foil 104 comprises excellent bulk thermal conductivity (k), as ell as providing a spring-like deflection capacity. This deflection capacity results in much higher compliance and recovery characteristics for the serpentine foil 104 when under compressive loading conditions as compared with those of most solid foil materials.

Because of the serpentine foil 104 shape, a TIM comprising the serpentine foil 104 may exhibit high levels of elastic recovery; in some cases the elastic recovery may be more than an order of magnitude higher than non-serpentine TIM structures. This property reduces the risk of thermal degradation of the TIM structures herein by maintaining contact through temperature cycling.

Figure 1D:
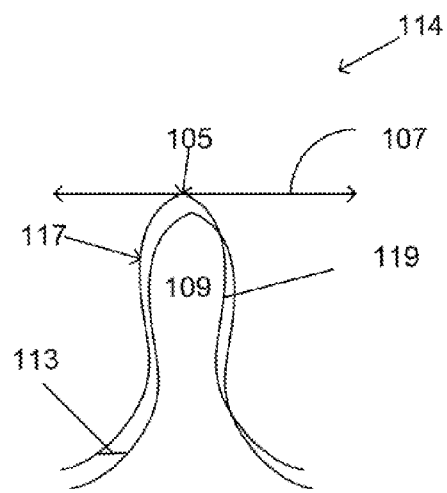

The serpentine foil 104 may comprise a repeating serpentine pattern. In an embodiment, the repeating serpentine pattern of the serpentine foil 104 may comprise a repeating loop pattern 114, as depicted in FIG. 1d. The repeating loop pattern 114 of the serpentine foil 104 comprises an apex portion 105, an exterior portion 117 and an interior portion 119. The apex portion 105 comprises a top, or peak portion of the repeating loop pattern 114, with 107 representing a line tangent to the apex portion 105. The interior portion 109 may comprise an adjacent space 109, which may comprise air 109 in some cases. In other embodiments, the space 109 may be filled with any suitable material according to the particular application.

Figure 1E:
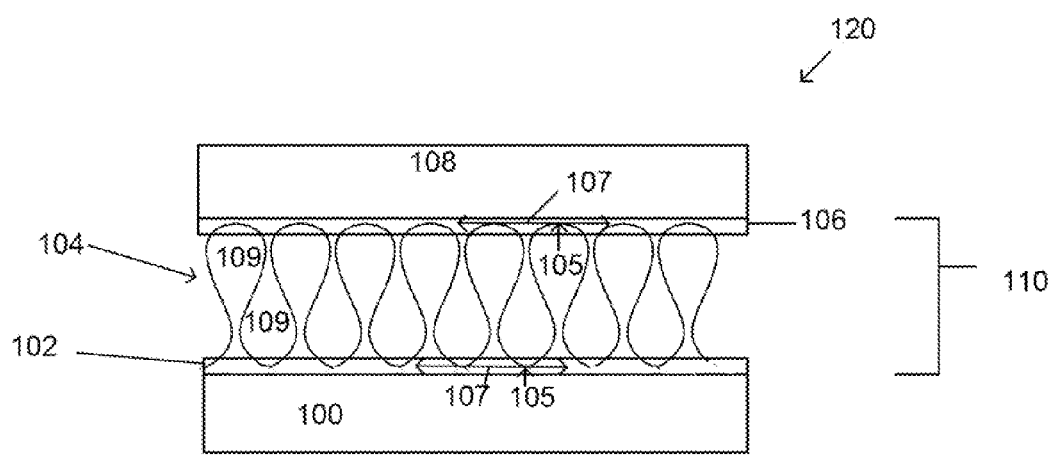

In an embodiment, a second interface material 106 may be formed/placed on the serpentine foil 104 (FIG. 1e). The second interface material 106 may be similar to the first interface material 102, and in other cases may be modified according to the particular application. In an embodiment, the thickness of the second interface material 106 may comprise about 1 microns to about 100 microns, but may vary according to the particular application. The first interface material 102, the serpentine foil 104 and the second interface material 106 comprise the serpentine TIM structure 110.

In an embodiment, the apex portions 105 of the serpentine foil 104 may be disposed in a substantially parallel position/angle 107 with at least one of the first and second interface materials 102, 106. In an embodiment, the apex portions 105 of the serpentine foil 104 may be in contact with at least one of the first and second interface materials 102, 106. An IHS 108 (which may comprise a heat sink in some cases) may be placed/disposed on the second interface material 106. In an embodiment, the TIM structure 110 may comprise a portion of a microelectronic package structure 120. In an embodiment, the TIM structure 110 may comprise a parallel TIM structure 110, since the serpentine foil 104 of the TIM structure 110 is oriented in a substantially parallel position in relation to the first and second interface materials 102, 106.

Figure 1F:
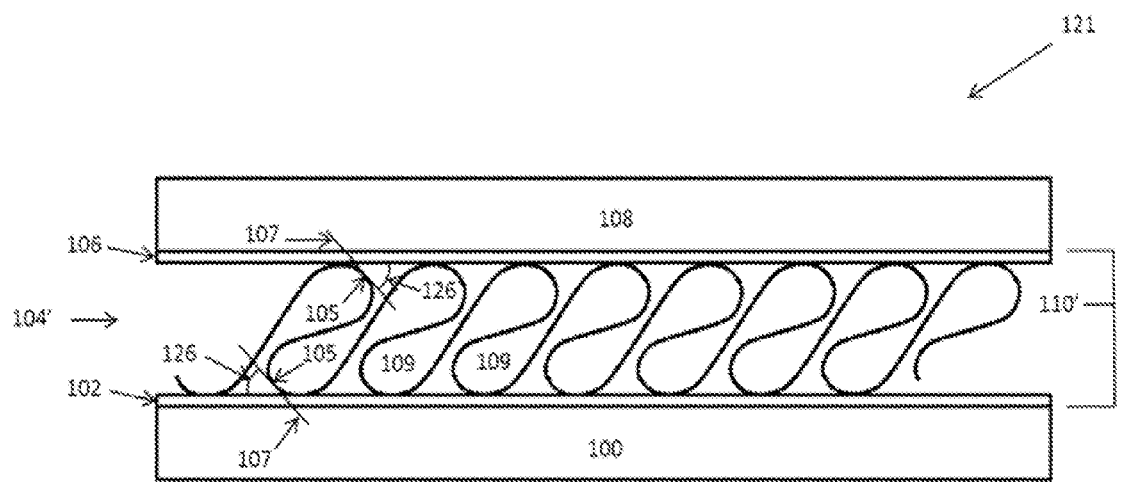

FIG. 1f depicts a TIM structure 110' comprising a rotated serpentine foil 104'. The rotated serpentine foil 104' may be formed by applying a shear force to the serpentine foil before it is assembled within the interface material. The rotation has the effect of greatly increasing the compliance of the rotated TIM structure 110' when under a compression state, which is desirable in certain applications. For example, the rotated TIM structure 110' may comprise a much lower stiffness than the parallel TIM structure 110 of FIG. 1e, in some cases, which may result in less stress applied to a device incorporating the rotated TIM structure 110'.

In an embodiment, an apex portion 105 of the rotated serpentine foil 104' is disposed in a rotated alignment with respect to at least one of the first and second interface materials 102, 106. In an embodiment, an angle 126 between at least one of the first and second interface materials 102, 106 and the tangent line 107 of the apex portion 105 of the serpentine foil 104' may not be substantially perpendicular to at least one of the first and second interfaces 102, 106. In another embodiment, the angle 126 may comprise between about a 10 degree to about a 50 degree angle 126, in relation to the first and second interface materials 102, 106. In an embodiment, the rotated TIM structure 110' may comprise a portion of a package structure 121, wherein an IHS 108 (which may comprise a heat sink in some cases) may be placed/disposed on the second interface material 106.

Figure 1G:
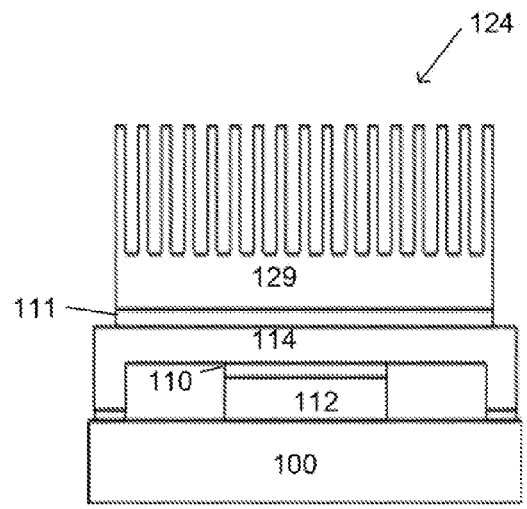

FIG. 1g depicts a package structure 124, wherein a first TIM structure 110 is disposed in a first location between a bottom portion of an IHS 114 and a top portion of a device 112, and a second TIM structure 111 is disposed in a second location between a top portion of the IHS 114 and a top portion of a heat sink 129. The device 112 may comprise one of a microelectronic memory die and a central processing unit die in some cases, but may comprise any type of suitable device 112 according to the particular application in other cases. The first TIM structure 110 may comprise one of a parallel TIM structure and a rotated TIM structure (as depicted in FIGS. 1e-1f respectively), and the second TIM 111 may comprise one of a parallel TIM structure and a rotated TIM structure.

Figure 1H:
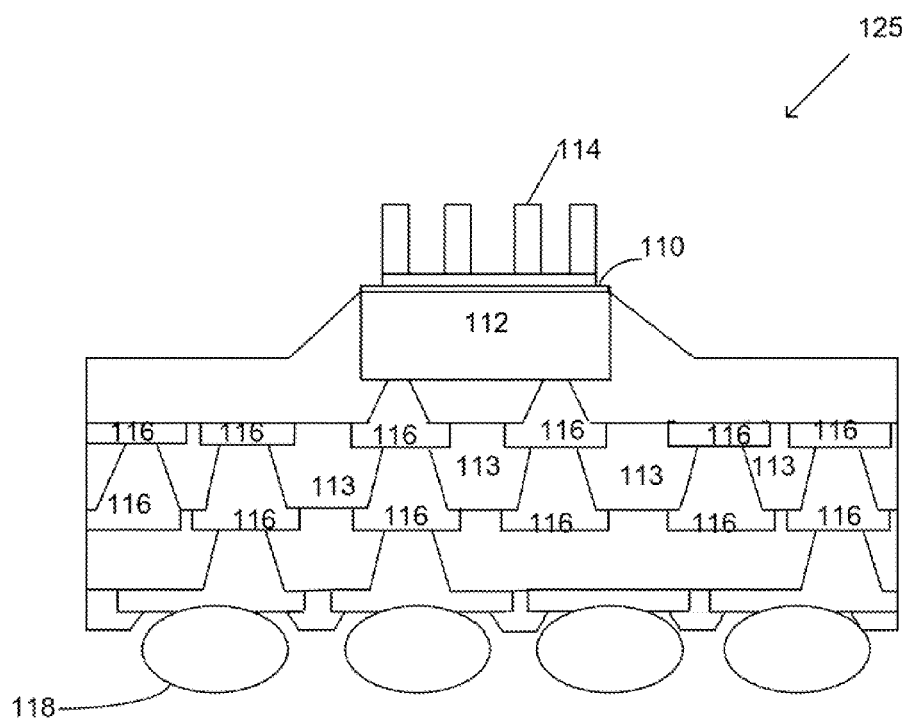

In FIG. 1h, a TIM structure 110 is depicted with a coreless, bumpless build up layer (BBUL) package structure 125, wherein the TIM structure 110 is located on a top portion of a device 112 and contacts a bottom portion of an IHS 114. The device 112 may comprise one of a microelectronic memory die and a central processing unit die in some cases, but may comprise any type of suitable device according to the particular application in other cases. The TIM structure 110, may comprise a parallel TIM structure or a rotated TIM structure as described herein. In some cases, the package structure 125 may comprise dielectric layers 113 alternating with conductive layer 116, with solder connections 118 disposed on a bottom surface of the package structure 125.

In the package structures of FIGS. 1g-1h the device 112 may be disposed in other locations, such as on a top surface of a BBUL package, for example, and the package structures 124, 125 may comprise any suitable type of package structures capable of providing electrical communications between a microelectronic device, such as a die and a next-level component to which the package structures may be coupled (e.g., a circuit board). In another embodiment, the various package structures herein may comprise any suitable type of package structures capable of providing electrical communication between a die and an upper integrated circuit (IC) package coupled with a lower IC package.

The package structures of the embodiments herein may also provide structural support for a device, such as a die. By way of example, in one embodiment, the package structures may comprise a multi-layer substrate—including alternating layers of a dielectric material and metal—built-up around a core layer (either a dielectric or metal core). In another embodiment, the package substrates may comprise a coreless multi-layer substrate. Other types of substrates and substrate materials may also find use with the disclosed embodiments (e.g., ceramics, sapphire, glass, etc.).

A die in the various Figures herein may comprise a silicon logic die or a memory die, for example, or any type of suitable microelectronic device/die, and may be disposed on a back side or on a front side of the package structures herein. In some embodiments the package structures may further comprise a plurality of dies, which may be stacked upon one another, depending upon the particular embodiment. In some cases the die(s) may be located/attached/embedded on either the front side, back side or on/in some combination of the front and back sides of the package structures. In an embodiment, the die(s) may be partially or fully embedded in the package structures of the embodiments.

Figure 2A:
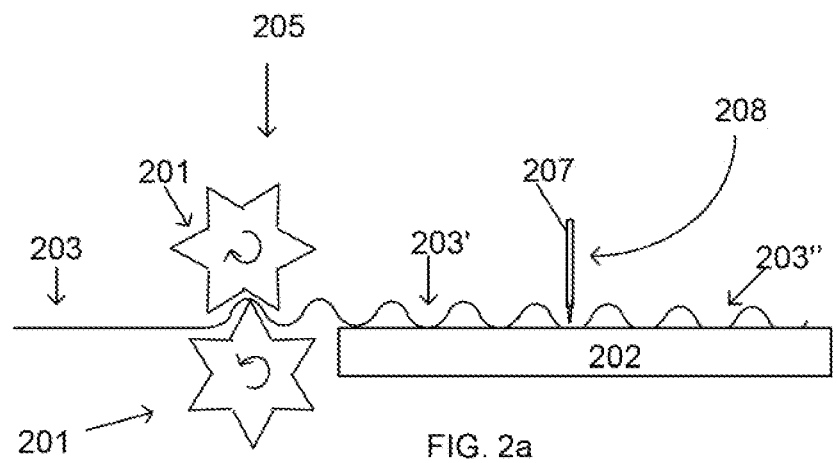
FIGS. 2*a*-2*d* represent methods according to embodiments.
Figure 2B:
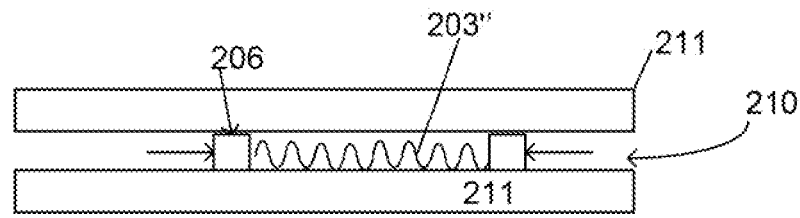
Figure 2C:
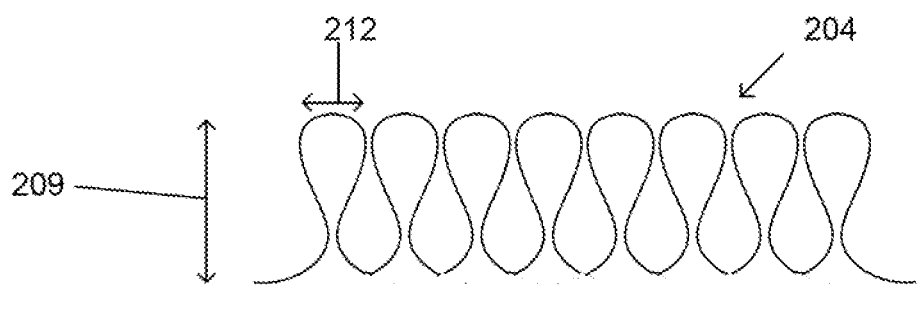

FIGS. 2a-2d depict processes/methods by which the serpentine foil may be manufactured/formed. In FIG. 2a, an un-crimped foil material 203 may be placed on a roller structure 202, where it may then be fed through a pair of intermeshing gears 201, which may apply a crimp pattern by using a crimping process 205 onto the foil 203. Next, the crimped foil 203' may undergo a singulation process 208, and may be singulated into individual serpentine foil pieces 203" by using a singulation tool 207. In FIG. 2b, the serpentine foil pieces 203" may undergo a compression process 210, wherein the singulated serpentine foil pieces 203" may be placed between two flat plates 211 with a controlled spacing while two additional plates 206 compress the serpentine foil pieces 203" into a more compressed serpentine foil 204 (FIG. 2c). The compressed serpentine foil 204 may comprise a height 209 and a loop width 212 that may be varied depending upon process conditions.

Figure 2D:
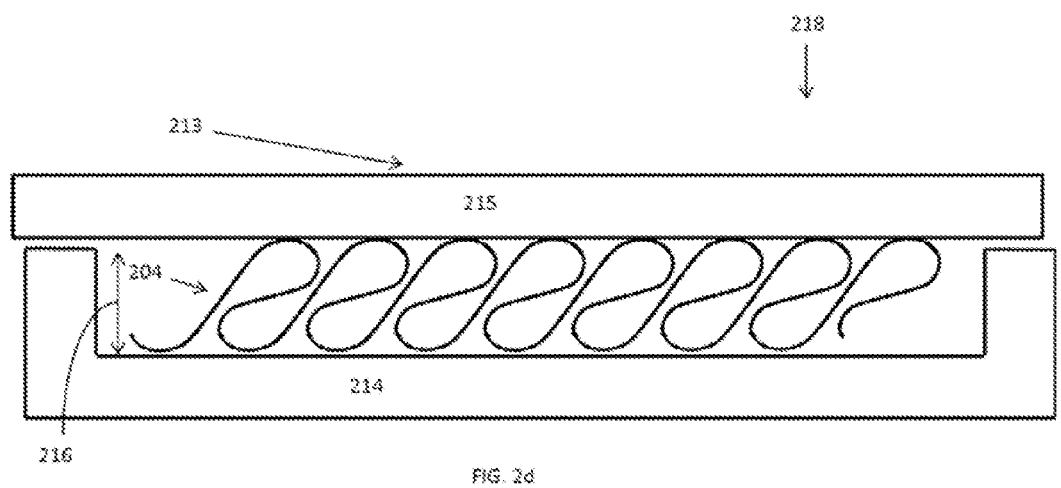

FIG. 2d depicts a serpentine foil 204 that may undergo a rotation process 218. The serpentine foil 204 may be transferred to a structure 214 comprising a cavity of a specific depth 216 that may be slightly less than the height 209 of the serpentine foil 204. A top plate 215 may be passed over the serpentine foil 204 while applying downward and lateral forces 213, thus causing the serpentine foil 204 to achieve a desired rotation. In some cases, the processes depicted in FIGS. 2a-2d may be automated as may be advantageous to the particular application.

The various embodiments of TIM structures included herein promote and improve thermal and mechanical reliability for the package structures that utilize the TIM structures described herein. In some embodiments, the various TIM structures herein comprise thermal conductivity values in the range of up to about 80 Watts per meter degrees Kelvin. The TIM structures herein increase the capability for improved thermal performance and cost reduction. Additionally, the reduced stress levels of the TIM structures disclosed herein relieve mechanical reliability risks that may be present in the overall package structure utilizing the TIM's herein. The TIM's of the embodiments herein can provide greater flexibility in package design choice, with opportunities to improve both cost and performance.

Figure 3:
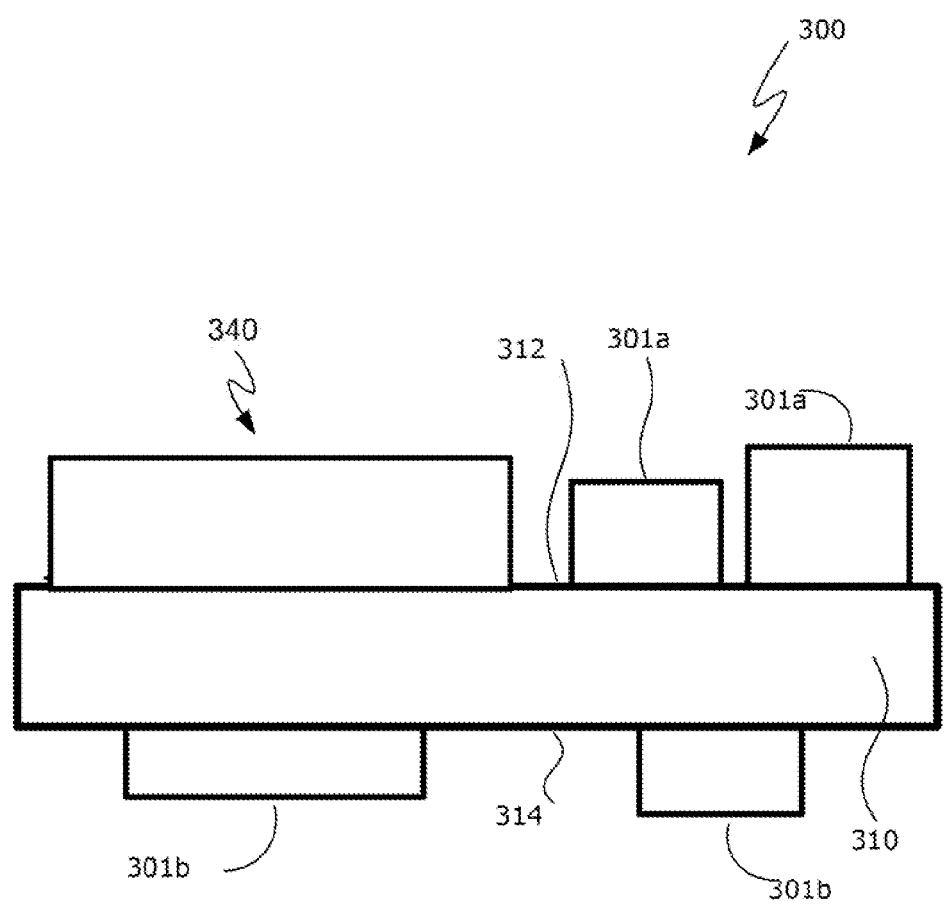
FIG. 3 represents a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structures of FIGS. 1g-1h, for example) disposed on the mainboard's first side 312, wherein the package structure 340 may comprise any of the package structure embodiments comprising the TIM structures described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
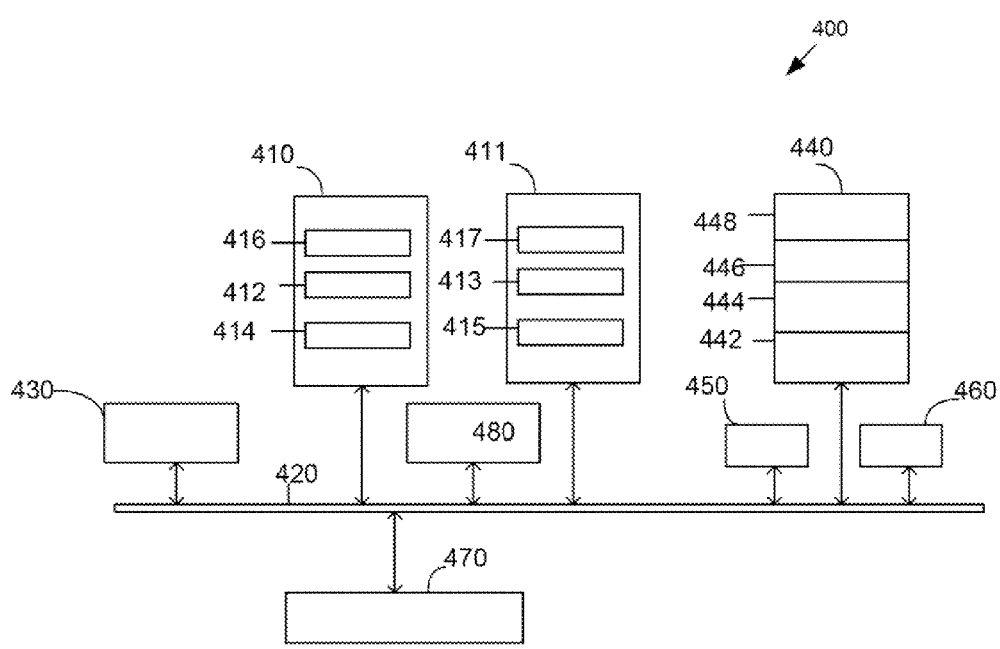
FIG. 4 represents a system according to embodiments.

FIG. 4 is a schematic of a computer system 400 according to an embodiment. The computer system 400 (also referred to as the electronic system 400) as depicted can embody/include a package structure/device that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a thermal interface material (TIM) comprising:
    forming a first interface material on a substrate;
    placing a serpentine foil on the first interface material, wherein the serpentine foil comprises a repeating serpentine pattern; and
    forming a second interface material on the serpentine foil, wherein an apex portion of the serpentine foil is in contact with and extends into at least one of the first and second interface materials.

2. The method of claim 1 further comprising wherein the apex portion of the serpentine foil is disposed in a substantially parallel position with at least one of the first and second interface materials.

3. The method of claim 1 further comprising wherein the apex portion of the serpentine foil is disposed in a rotated alignment with respect to at least one of the first and second interface materials.

4. The method of claim 1 further comprising wherein the serpentine foil comprises a thickness of between about 100 microns to about 1000 microns.

5. The method of claim 1 further comprising wherein at least one of the first and second interface materials comprise a thickness of between about 1 to about 100 microns.

6. The method of claim 1 further comprising wherein the TIM comprises an air space adjacent an interior portion of the serpentine foil.

7. The method of claim 1 further comprising wherein the repeating serpentine pattern comprises a repeating loop structure.

8. The method of claim 1 further comprising wherein the serpentine foil comprises copper.

9. The method of claim 1 further comprising wherein at least one of the first and second interface materials comprises at least one of thermal grease, thermal epoxy, polymer materials, phase-change materials, tin and indium.

10. The method of claim 1 further comprising wherein the rotated alignment comprises wherein the apex is disposed at an angle with respect to at least one of the first and second interface materials, and wherein the angle is not substantially parallel to the first and second interface materials.

11. The method of claim 10 further comprising wherein the angle comprises between about a 10 to about an 80 degree angle with respect to the first and second interface materials.

12. The method of claim 1 further comprising wherein the TIM comprises a portion of a package structure.

13. The method of claim 12 further comprising wherein the TIM is formed between a bottom portion of a device and a top portion of the package structure.

14. The method of claim 13 wherein the device comprises one of a microelectronic memory die and a central processing unit die.

15. The method of claim 12 wherein the TIM is formed between a top portion of a device disposed on the package structure and an integrated heat structure.

16. The method of claim 15 wherein the device comprises one of a microelectronic memory die and a central processing unit die.

17. The method of claim 1 further comprising wherein the serpentine foil is formed by a crimping process.

18. The method of claim 17 further comprising wherein the serpentine foil is compressed.

19. The method of claim 18 wherein the serpentine foil is rotated with a shear force process.

20. The method of claim 17, wherein the crimping process comprises feeding a foil material through a pair of intermeshing gears.

21. The method of claim 20, further including singulating the foil material into individual, singulated serpentine foil pieces.

22. The method of claim 21, further including compressing the singulated serpentine foil piece to form the serpentine foil.

23. The method of claim 22, wherein compressing the serpentine foil comprises placing the singulated serpentine foil piece between two flat plates with a controlled spacing therebetween and compressing the singulated serpentine foil with additional plates between the two flat plates and on opposing ends of the singulated serpentine foil.

24. A thermal interface material (TIM) structure comprising:
    a first interface material on a substrate;
    a serpentine foil disposed on the first interface material, wherein the serpentine foil comprises a repeating serpentine pattern; and
    a second interface material on the serpentine foil, wherein an apex portion of the serpentine foil is in contact with and extends into at least one of the first and second interface materials.

25. The structure of claim 24 further comprising wherein the apex portion of the serpentine foil is disposed in a substantially parallel position with at least one of the first and second interface materials.

26. The structure of claim 24 further comprising wherein the apex portion of the serpentine foil is disposed in a rotated alignment with respect to at least one of the first and second interface materials.

27. The structure of claim 24 further comprising wherein the serpentine foil comprises a thickness of between about 100 microns to about 1000 microns.

28. The structure of claim 24 further comprising wherein at least one of the first and second the interface materials comprises a thickness of between about 1 and about 100 microns.

29. The structure of claim 24 further comprising wherein the TIM comprises an air space adjacent an interior portion of the serpentine foil.

30. The structure of claim 24 further comprising wherein the repeating serpentine pattern comprises a repeating loop structure.

31. The structure of claim 24 further comprising wherein the serpentine foil comprises copper.

32. The structure of claim 24 further comprising wherein at least one of the first and second interface materials comprises at least one of thermal grease, thermal epoxy, polymer materials, phase-change materials, tin and indium.

33. The structure of claim 24 further comprising wherein the rotated alignment comprises wherein the apex is disposed at an angle with respect to at least one of the first and second interface materials, and wherein the angle is not substantially parallel to the first and second interface materials.

34. The structure of claim 33 further comprising wherein the angle comprises about a 10 to about a 80 degree angle.

35. The structure of claim 24 further comprising wherein the TIM comprises a portion of a package structure comprising a device.

36. The structure of claim 35 further comprising wherein the TIM is formed between a bottom portion of the device and a top portion of the package structure.

37. The structure of claim 35 wherein the TIM is formed between a top portion of the device and a bottom portion of an integrated heat structure disposed on the device.

38. The structure of claim 35 wherein the device comprises a microelectronic memory die.

39. The structure of claim 35 wherein the device comprises a central processing unit die.

40. The structure of claim 35 further comprising wherein the package structure comprises a portion of a coreless BBUL package.

41. The structure of claim 40 wherein the package structure further comprises at least one of a CPU and a memory die.

* * * * *